Figure 1:
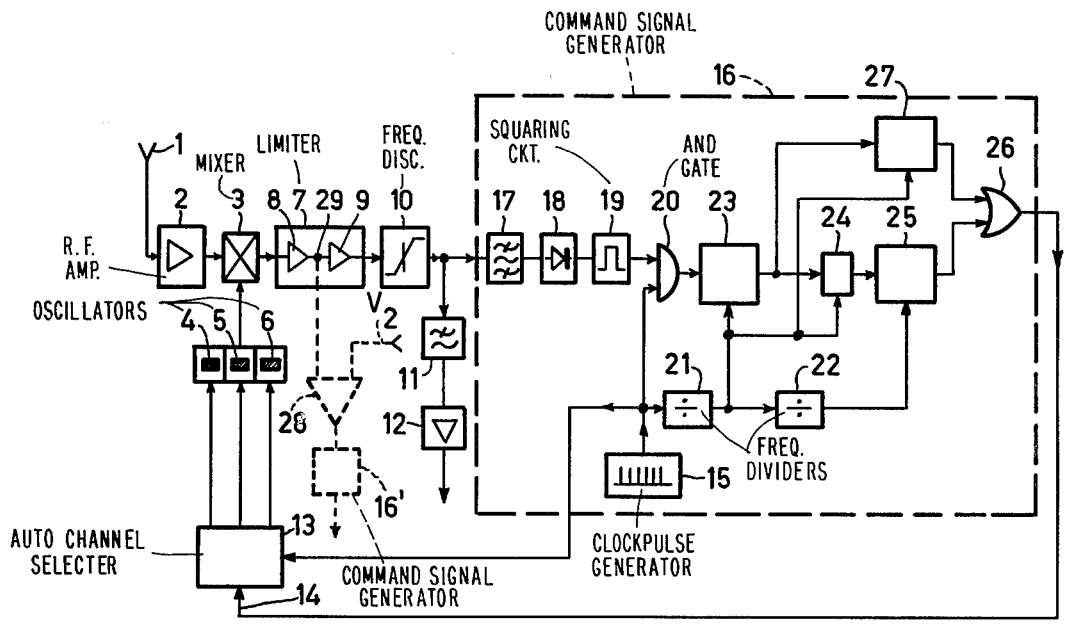

United States Patent [19]

Chastagnier et al.

[11] 4,174,501

[45] Nov. 13, 1979

[54] COMMAND SIGNAL GENERATOR FOR AN AUTOMATIC CHANNEL SELECTION DEVICE IN A RADIO WHICH IS MOBILE RELATIVE TO TRANSMITTER STATIONS

[75] Inventors: Jean Chastagnier; Jean C. Massip, both of Brive la Gaillarde, France

[73] Assignee: U.S. Philips Corporation, New York, N.Y.

[21] Appl. No.: 885,610

[22] Filed: Mar. 13, 1978

[30] Foreign Application Priority Data

Mar. 9, 1977 [FR] France ................................. 77 06964

[51] Int. Cl.² .......................... H04B 3/60; H04B 1/26
[52] U.S. Cl. .................................... 325/56; 325/469; 343/205
[58] Field of Search ....................... 325/64, 63, 55, 56, 325/51, 464, 468, 469, 470; 343/179, 200, 205

[56] References Cited

U.S. PATENT DOCUMENTS

| | | | |
|---|---|---|---|
| 2,521,696 | 9/1950 | De Armond | 325/56 |
| 3,160,813 | 12/1964 | Biggi et al. | 325/56 |
| 3,806,819 | 4/1974 | Leonard | 325/464 |
| 3,983,492 | 9/1976 | Fisher et al. | 325/468 |
| 4,092,600 | 5/1978 | Zimmermann et al. | 325/55 |

*Primary Examiner*—Marc E. Bookbinder
*Attorney, Agent, or Firm*—Thomas A. Briody; William J. Streeter

[57] ABSTRACT

This device which can be used in a phase or frequency modulation receiver, is connected to the output of the frequency discriminator of the receiver and comprises means for forming a logic signal which indicates the presence or absence of noise, a gate which transmits the clock pulses when a logic signal indicates the presence of noise, means for counting the transmitted clock pulses and for supplying a command signal for controlling a channel selection device, either which during a sequence of n time intervals $\tau$ a number of pulses counted during each time interval $\tau$ attains a first threshold, or when the number of pulses counted during a time interval $\tau$ attains a second threshold which is higher than the first threshold.

5 Claims, 3 Drawing Figures

COMMAND SIGNAL GENERATOR FOR AN AUTOMATIC CHANNEL SELECTION DEVICE IN A RADIO WHICH IS MOBILE RELATIVE TO TRANSMITTER STATIONS

The invention relates to a command signal generator for a channel selection device in a radio receiver for frequency or phase modulation which is mobile relative to fixed transmitter stations transmitting at mutually different frequencies.

Such a device can, for example, be used in a radio link between a train and fixed stations, distributed along the railway. There are, for example, three possible transmission frequencies and two fixed consecutive stations transmit at mutually different frequencies. If the train traverses the distance between two stations, the receiver in the train must be tuned so at a given moment that, instead of the frequency of the station just passed, the frequency of the next station is received.

For solving this kind of problem it is advantageous to use a receiver in the train which can be tuned to the various possible transmission frequencies and which is provided to that end with an automatic channel selection device consisting, for example, of a circuit which automatically switches-on local oscillators. The command generator serves for supplying a signal for controlling the channel selection circuit in case of a given deterioration in the reception. But it should be noted that, to maintain a certain quality of the reception in the train the automatic channel selection must be switched on before reception is rendered impossible, that is to say from the instant the least possible disturbances become apparent; this is, for example, important if the link is used for data transmission.

With the VHF/UHF transmission frequencies used in the phase or frequency modulator it appears that the first deterioration in the link occurring when the mobile body with the receiver travels away from a fixed station is not due to a decrease in the average value of the field received, but to rapid, and, in principle, cyclic changes of the latter, caused by the reception of components travelling along different propagation paths.

The present invention utilizes the deterioration in the signal-to-noise ratio occurring due to this cyclic disturbances for generating in the receiver a command signal for controlling the automatic frequency selection, at the same time solving the problem arising from the considerable variations in the velocity of the mobile body. The frequency of the disturbances of the field received is, proportional to the velocity of the mobile body, while below a given field threshold, the duration of each disturbance is inversely proportional to this velocity.

According to the invention a command signal generator for a channel selection device in a radio receiver for phase or frequency modulation comprises:
means for forming a logic signal indicating whether the level of the signal received is above or below a given threshold,
a gate passing the pulses of a clock pulse generator if said logic signal attains the value indicating that the level of the received signal is below said threshold,
means for counting the clock pulses passed by said gate during given time intervals, derived from the clock pulse generator, and for supplying a command signal either, when during a sequence of n time intervals $\tau$ the number of pulses counted during each time interval $\tau$ attains a first given threshold value, or when the number of pulses counted during a time interval $\tau$ attains a second given threshold value which is higher than said first threshold value.

The invention will be further explained with reference to the accompanying drawings.

Figure 2:
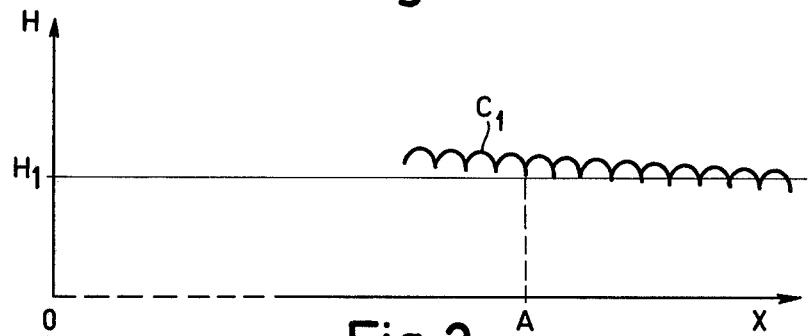
Figure 3:
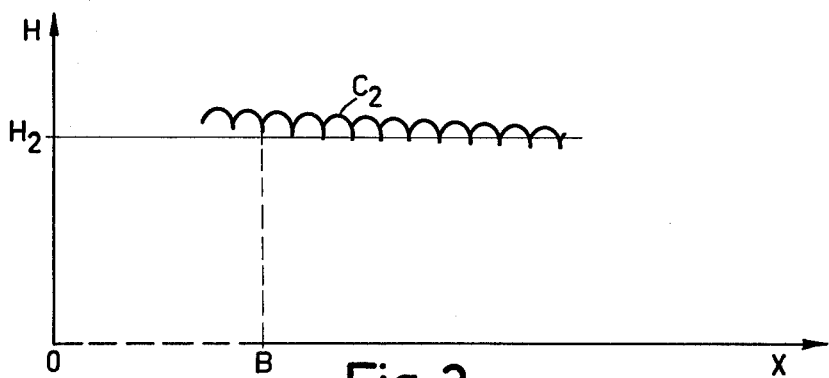

FIG. 1 shows a FM-radio receiver comprising a command generator according to the invention, FIGS. 2 and 3 are diagrams of the field received as a function of the distance between the receiver and a transmitting station and correspond, respectively, to two variants of the manner in which the command generator according to the invention may have been incorporated in the receiver.

The FM-receiver shown in a simplified manner in FIG. 1 comprises the receiving aerial 1, a section 2 comprising an amplifier for amplifying the received high-frequency signal and which may also comprise a stage for converting the amplified high-frequency signal to a lower frequency. This first intermediate frequency, which can have different values depending on the frequency received (three values in the relevant example), is converted into a second fixed intermediate frequency in mixer stage 3 to which, depending on the frequency received, one frequency out of three frequencies derived from the quartz oscillators 4, 5, 6 is supplied. The output of the mixer stage 3 is connected to an amplitude limiter 7 consisting of two high-power amplifier stages 8, 9. The output of the limiter 7 is connected to a frequency discriminator 10, which supplies a low-frequency signal which is filtered in the filter 11 and thereafter amplified in amplifier 12. The passband of the filter 11 extends from, for example, 0 to 3 kHz, in correspondance to the band of the transmitted useful signal.

In addition, the receiver comprises an automatic channel selector 13, which cyclically actuates the three quartz oscillators 4, 5, 6 if this channel selector receives a command signal at input 14. The cycle and the switching instants are generated in known manner, starting from the pulses of clock generator 15.

The receiver is mobile relative to the fixed stations transmitting at mutually different frequencies (three in the example considered). The command signal generator according to the invention is denoted in FIG. 1 by reference numeral 16 and applies the command signal to the input 14 of the automatic channel selector 13 if the quality of the radio link with a fixed transmitter station from which the mobile receiver moves away becomes poor, in order to effect the connection to another fixed transmitter station which the receiver approaches. As explained above it is important that the deterioration of the quality of the reception is detected as soon as possible.

The command signal generator is based on the phenomenon which will be explained below by means of the diagramme of FIG. 2. In this diagramme curve $C_1$ represents the variation of the field H received at the receiving aerial 1, as a function of the distance between the receiver and the transmitting station, located in the origin O. However, the field H is only shown near point A beyond which the problem of the deterioration of the reception arises. It appears that at the frequencies VHF/UHF used in the frequency modulation the field represented by the curve $C_1$ decreases on an average when the distance increases, but that, in addition the field is affected by brief diminutions of the field strength owing to interferences caused by the fact that the signal is propagated along different paths between the transmitting aerial and the receiving aerial. The distance between two successive diminutions of the field strength is, in theory, equal to λ/2 for interferences between the signal which traverses the direct path and the signal traversing a path via a single reflecting obstacle: for example λ/2=33 cm at a frequency of 450 MHz. If $H_1$ is the field above which the limiter 7 of the receiver is no longer saturated it will be noted that beyond the point A the received field H is represented by the curve $C_1$ which briefly assumes values below $H_1$ and, as known, this is accompanied by the appearance of noise pulses at the output of the limiter 7 and, consequently, at the outputs of the frequency discriminator 10. As the field H decreases on an average when the distance increases, it will be seen that the duration of the noise pulses also increases versus the distance at a given speed of receding. But on the other hand this speed can vary to a considerable extent (for example in the case where the mobile body is a train) and it is clear that the frequency of the noise pulses is proportional to the speed, whereas the duration is inversely proportional to this speed. The command signal generator utilizes these noise pulses for generating a command signal for controlling the automatic selection of the frequency by making itself independent to a large extent of the speed of the mobile body.

In the embodiment of the receiver, shown in FIG. 1, the command signal generator 16, forming part thereof, is connected to the output of the frequency discriminator 10. The latter comprises a bandpass filter 17 which selects the noise outside the band of the useful signal selected by filter 11 of the receiver. The passband of filter 17 extends from, for example, 3 to 6 kHz. The circuit 19 squares the noise pulses detected by the rectifier circuit 18. This circuit supplies logic pulses which correspond to the noise pulses and whose value is "1" or "0", depending on whether the strength of the received field H is below or above a given threshold value of the field $H_1$.

An AND-gate 20 passes the pulses of the clock pulse generator 15 when the logic pulses, supplied by the circuit 19, have the value "1" which indicates the presence of noise.

The pulses of the clock pulse generator 15 are applied to the cascade arrangement of the two frequency dividers 21 and 22, supplying synchronous pulses respectively, which are separated by the time interval $\tau$ and the time interval $n\tau$ (n being an integer).

The clock pulses transmitted by the gate 20 are applied to the counting device 23 which is reset to the initial position by each output pulse of the divider 21, that is to say at instants spaced by the time interval $\tau$. In addition, this counter 23 is also reset to its initial position, each time the number of counted pulses achieves a predetermined value N, and supplies an output pulse then. The output pulses of the counter 23 are applied to a D-type flip-flop 24 which is reset to zero at instants spaced by the time interval $\tau$ and which changes state only once during a time interval $\tau$, if the counter 23 has counted N clock pulses. Each time flip-flop 24 changes state this causes the contents of a counter 25 to be increased by one. The counter 25 is reset to the initial position by each output pulse of the divider 22, that is to say at instants spaced by the time interval $n\tau$. When the contents of the counter 25 attains the number n it supplies a pulse which is used, via the OR-circuit 26 as a command signal for controlling the automatic channel selector circuit 13. This command signal can alternatively be obtained by means of a counter 27. Said counter receives the output pulses of the counter 23 and is reset to the initial position at instants separated by the time interval $\tau$. When the contents of the counter 27 attains a number n it supplies a pulse which is applied, via the OR-circuit 26, as a command signal to the automatic channel selector 13.

The command signal generator 13 just described operates in the following manner: The AND-gate 20 supplies a series of clock pulses. The number of pulses in a series depends on the duration of a noise pulse. The frequencies of the pulse trains is proportional to the frequency of the noise pulses.

The counter 25 supplies a command signal if, after n consecutive time intervals $\tau$ the duration of the noise in each time interval $\tau$ is equal to or greater than a given duration V corresponding to N clock pulses. This, finally, means that the brief disturbances of the link, as defined in FIG. 2, are only then of importance for generating the command signal when at least n consecutive disturbances occur with a duration which is at least equal to V.

The counter 27 supplies a command signal when, after a time interval $\tau$, the duration of the noise in this interval exceeds a given period of time which corresponds to mN clock pulses. It is, for example, possible to choose the counting threshold m of the counter 27 so, that the command signal is only supplied if the noise lasts for the entire time interval $\tau$. The command signal supplied by the counter 27 is earlier than the signal from counter 25, and indicates a very poor connection.

If during the frequency selection switching on of the quartz oscillators 4, 5, 6 result in that no noise occurs at the output of the discriminator 10, the selection is stopped and the receiver remains tuned to the relevant transmitter station.

By a suitable choice of the different parameters defined above, namely the frequency of the pulses of clock pulse generator 15, the time interval $\tau$, the numbers n, M, m, it can be achieved that generating the command signal is highly independent of the speed of the mobile body. This choice must be performed for any special application, particularly in dependency on the ratio between the maximum and minimum speed of the mobile body.

In FIG. 1, the command signal generator 16 is connected to the output of the frequency discriminator 10. It is obvious that the command signal generator 16 can alternatively be connected to the output of the amplitude limiter 7 for detecting, when the received field H falls to below the field threshold $H_1$, at which the limiter 7 is no longer saturated, substantially the same noise pulses.

But it is alternatively possible to use as input signal for the command signal generator 16 the signal occurring in a point located between the amplifier stages 8 and 9 which form the amplitude limiter 7. This variant is shown in FIG. 1 by means of dotted lines. The device 16', which is similar to 16, is connected to the output of a voltage comparison circuit 28. An input of this comparison circuit is connected to the point 29 between the amplifier stages 8 and 9, forming the limiter 7, and the other input of the comparison circuit receives a reference voltage $V_2$. The comparison circuit 28 is arranged so that it only supplies a signal when the voltage at the input connected to point 29 is lower than the reference voltage $V_2$.

This variant is based on the fact that with a signal at the inputs of the limiter 7, which signal is of such a value that limitation takes place, the amplifier stage 8 operates in the non-linear portion of its gain characteristic, a distorted signal having a very extensive spectrum occurring in point 29. If the reference voltage $V_2$ is located in the output voltage zone of the stage 8, in which the signal is formed, it will be seen that, when the voltage at the input of the limiter, so the received field, is lower than a given threshold corresponding to $V_2$, a signal, having an extensive spectrum, appears at the output of the comparison circuit 28. The command signal generator 16', which is identical to 16, specially comprises at its input a bandpass filter which selects a portion of the spectrum of the output signal of the comparison circuit 28.

As can be proved by means of FIG. 3 this variant enables the obtaining of the command signal in an earlier stage, namely prior to the appearance of the noise pulses, in the output of the frequency discriminator, so just before the reception is going to be disturbed. In this FIG. 3 which, for clearness' sake, is placed opposite to FIG. 2, curve $C_2$ denotes the received field near a point B, the distance OB to the transmitter station, located in 0, being shorter than the distance 0A in FIG. 2. This curve $C_2$, which has a similar variation as the curve $C_1$ in FIG. 2, is affected by the same disturbances but on average the field H represented by this curve $C_2$ exceeds the average field represented by the curve $C_1$. The field $H_2$ corresponds to the threshold voltage $V_2$ applied to the voltage comparison circuit 28. This field $H_2$ is larger than the field $H_1$ in FIG. 2. If the received field H decreases and becomes smaller than field $H_2$ pulses are obtained at the output of the comparison circuit 28 which are similar to the noise pulses utilized in the command generator 16' for generating the command signal for controlling the automatic channel selector 13.

What is claimed is:

1. A command signal generator for a channel selection device in a radio receiver for frequency or phase modulation which is mobile relative to fixed transmitter stations transmitting at mutually different frequencies, wherein the generator comprises:
   means for forming a logic signal indicating whether the level of the received signal is above or below a first given threshold,
   a gate which passes the pulses of a clock pulse generator if said logic signal attains the value which indicates that the level of the received signal is below said threshold,
   means for counting the clock pulses passed by said gate during given time intervals derived from the clock pulse generator and for supplying a channel change command signal either when during a sequence of n time intervals $\tau$ the number of pulses counted during each time interval $\tau$ attains a first given threshold, or when the number of pulses counted during a time interval $\tau$ attains a second given threshold value which is higher than said first given threshold value.

2. A command signal generator as claimed in claim 1, wherein the receiver comprises a frequency discriminator having an output coupled to said command signal generator and said command signal generator comprises a filter coupled to said forming means which selects the noise at the output of the frequency discriminator outside the band of the transmitted useful signal.

3. A command signal generator as claimed in claim 1, wherein the receiver comprises an amplitude limiter having an amplifier circuit having an internal terminal point, a circuit which transmits a signal below a given threshold coupled between said terminal point and said command signal generator.

4. A command signal generator as claimed in any of the claims 1 to 3, wherein said counting means comprises a first counter which counts the clock pulses until N pulses are counted, these pulses being transmitted by said gate, a flip-flop being reset to its initial position at the end of each interval $\tau$, said flip-flop being reset to zero at the end of each time interval $\tau$ and whose change in state is controlled by the first counter during a time interval $\tau$, and a second counter which counts said changes in the state of the flip-flop and is reset to zero at the end of time intervals having a duration n $\tau$ and which supplies a frequency selection command signal when it has counted to n.

5. A command signal generator as claimed in claim 4, wherein said counting means comprises a third counter which counts the pulses supplied at the output of the first counter when the latter has achieved its final position and is reset to zero at the end of each time interval $\tau$ and supplies a command signal when it has counted n pulses.

* * * * *